(12) United States Patent
Leveque et al.

(10) Patent No.: US 7,058,119 B1
(45) Date of Patent: Jun. 6, 2006

(54) PARALLEL ARCHITECTURE DIGITAL FILTER AND SPREAD SPECTRUM SIGNAL RECEIVER USING SUCH A FILTER

(75) Inventors: Sebastien Leveque, La Cote Saint Andre (FR); Norbert Daniele, Montbonnot (FR); Didier Lattard, Rencurel (FR); Bernard Piaget, Vernon (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/831,166

(22) PCT Filed: Nov. 8, 1999

(86) PCT No.: PCT/FR99/02724

§ 371 (c)(1),
(2), (4) Date: May 7, 2001

(87) PCT Pub. No.: WO00/28662

PCT Pub. Date: May 18, 2000

(30) Foreign Application Priority Data

Nov. 9, 1998 (FR) .................................. 98 14071

(51) Int. Cl.
*H04B 1/69* (2006.01)
*H04B 1/707* (2006.01)

(52) U.S. Cl. ....................... 375/150; 375/140; 375/152; 375/343

(58) Field of Classification Search ........ 375/229–236, 375/147, 316, 140, 148, 150, 152, 343; 341/155–172; 708/320, 323

See application file for complete search history.

(56) References Cited

U.S. PATENT DOCUMENTS

| | | | | |
|---|---|---|---|---|
| 4,777,612 A | * | 10/1988 | Tomimitsu | 708/316 |
| 4,779,225 A | * | 10/1988 | Fukasawa et al. | 708/322 |
| 4,852,035 A | | 7/1989 | Michener | 708/313 |
| 4,947,362 A | * | 8/1990 | Bui | 708/322 |
| 5,031,133 A | * | 7/1991 | Sasaki | 708/319 |
| 5,103,416 A | * | 4/1992 | Cavallotti et al. | 708/319 |
| 5,222,144 A | * | 6/1993 | Whikehart | 381/15 |
| 5,381,357 A | * | 1/1995 | Wedgwood et al. | 708/319 |
| 5,781,076 A | * | 7/1998 | Iwamatsu et al. | 332/103 |
| 5,809,074 A | * | 9/1998 | Werner et al. | 375/233 |

FOREIGN PATENT DOCUMENTS

| | | |
|---|---|---|
| DE | 19627305 | 7/1997 |
| WO | WO93/23924 | 11/1993 |

OTHER PUBLICATIONS

Couturier, et al., "Experimental Results for Four Phase Digital Matched Filtering of Spread Spectrum Waveforms", vol. 34, No. 8, 5 pages.

* cited by examiner

*Primary Examiner*—Kenneth Vanderpuye
*Assistant Examiner*—Jason M. Perilla
(74) *Attorney, Agent, or Firm*—Thelen Reid & Priest LLP (57) ABSTRACT

This invention relates to parallel architecture digital filter and signal receiver with spectrum spreading using such a filter, the filter may have p shift registers ($R^p$, $R^i$) with means for calculating a weighted sum of stored samples in the registers, p weighted sums ($S_k^p$, $S_k^i$) may be obtained and recombined with number p being, for example, equal to 2.

10 Claims, 12 Drawing Sheets

PARALLEL ARCHITECTURE DIGITAL FILTER AND SPREAD SPECTRUM SIGNAL RECEIVER USING SUCH A FILTER

This application is a national phase of PCT/FR99/02724, and International Application No. 98/14071, which was filed on Nov. 22, 1999, and was not published in English.

TECHNICAL FIELD

The object of the present invention is a parallel architecture digital filter and a signal receiver with spectrum spreading using such a filter.

The filter of the invention may be used in any technique with a high information rate, but it is particularly suitable for direct sequence spread spectrum digital transmissions where it may be used as an adapted filter. Therefore the invention finds a particular application in wireless local networks (WLAN), in local loops for wireless subscribers (WLL), in mobile telephony, in home automation and remote data collection, communications in transportation, in cable television and in multimedia services on cable networks, etc. . . .

STATE OF THE PRIOR ART

The spectrum spreading technique consists in modulating a digital symbol to be transmitted by a pseudorandom sequence known to the user. Each sequence is composed of N elements called "chips", the period of which is the Nth fraction of the period of a symbol. This results in a signal with a spectrum spreading over an N-fold larger range as that of the original signal. On reception, demodulation consists in correlating the received signal with the sequence used upon emission in order to rediscover the initial symbol.

This technique has many advantages:

discretion, as the emitted signal power is constant and spread over an N-fold larger band, its power spectral density is reduced by a factor N;

immunity with regards to intentional or parasitic narrow band emissions, the correlation operation carried out at the receiver's level leading to spectral spreading of these emissions;

interception difficulty (for the usual signal-to-noise ratios), as demodulation requires knowledge of the sequence used upon emission;

resistance to multiple paths which, under certain conditions, cause frequency selective fading and therefore only affect the emitted signal partly;

possibility of using code divison multiple access (CDMA): several direct sequence spread spectrum links may share the same frequency band by using orthogonal spreading codes.

A description of this technique may be found in two general references:

Andrew J. VITERBI: "CDMA-Principles of Spread Spectrum Communication", Addison-Wesley Wireless Communications Series, 1975, John G. PROAKIS: "Digital Communications", McGraw-Hill International Editions, 3$^{rd}$ edition, 1995.

Figure 1:
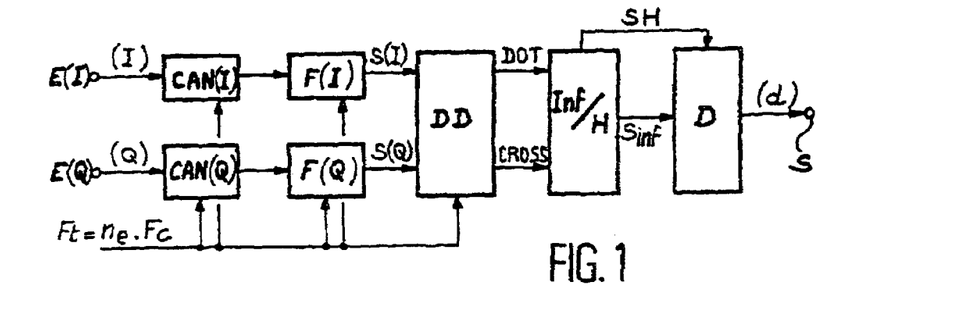
FIG. 1 already described, shows a known receiver for spread spectrum signals.

Appended FIG. 1 illustrates the general structure of a direct sequence spread spectrum signal receiver. As an example, it is assumed that the modulation carried out upon emission is a phase difference modulation. Receiver of FIG. 1 includes two parallel channels, marked by indices I and Q, for treating a signal in phase with the carrier and a signal in phase quadrature with the latter. The receiver thus comprises two inputs E(I), E(Q), two analog/digital converters CAN(I), CAN(Q), two adapted filters F(I), F(Q) delivering two signals S(I), S(Q), a differential demodulation circuit DD delivering two signals traditionally marked as "DOT" and "CROSS" (which are the sums or differences of the sample products), a Inf/H circuit, restoring an information signal Sinf and a clock signal SH, and finally a decision circuit D, the output S of which restores data d.

Each adapted filter F(I), F(Q) performs a correlation operation between the received signal and a pseudorandom sequence used upon emission. This operation consists in storing a certain number of successive samples and in performing a weighted sum by means of weighting coefficients which are the coefficients of the digital filter. In the particular case of direct sequence spectrum spreading using binary sequences, these coefficients are equal to +1 and to −1, according to the sign of the chips forming the pseudorandom sequence.

Analog/digital converters CAN(I) and CAN(Q) operate at frequency $F_f=n_eF_c$ where $F_c$ is the chip frequency ($F_c=1/T_c$), $n_e$ is the number of samples taken in a chip period ($T_c$) and N is the number of chips in each sequence. The number of stored samples is equal to $n_eN$. For simplifying the discussion, it will be assumed that only one sample is taken per chip. The number of samples taken into account and coefficients is therefore equal to N.

The correlation operation consists in multiplying the retained samples, noted as $I_{k-j}$, where k is a time index and j is a shift with respect to this index, with as many coefficients noted as $C_{N-1-j}$, and in calculating the sum of these products i.e.:

$$C_{N-1}I_k+C_{N-2}I_{k-1}+ \ldots +C_0I_{k-(N-1)}$$

which may be written:

$$S_k = \sum_{j=0}^{N-1} C_{N-1-j}I_{k-j}$$

This weighted sum is obtained at each sampling period and therefore depends on index k. Signal $S_k$ represents the required correlation signal. Generally, it exhibits a very sharp peak when all the samples taken into account correspond to the chips of the pseudorandom sequence used upon emission.

Figure 2:
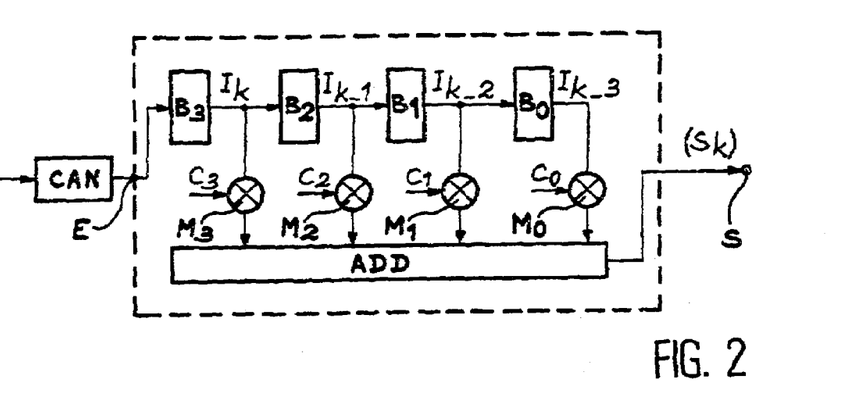
FIG. 2 already described, shows a known digital filter.

FIG. 2 shows a circuit, called an adapted filter, able to produce the signal $S_k$. The illustrated example corresponds to the simple case when N=4. As illustrated, this circuit comprises an input E connected to a analog/digital converter CAN, a shift register formed with four flip-flops $B_0,B_1,B_2,B_3$ for multipliers $M_0,M_1,M_2,M_3$ receiving on the one hand the four samples $I_k$, $I_{k-1}$, $I_{k-2}$, $I_{k-3}$ stored in the flip-flops and four coefficients $C_3,C_2,C_1,C_0$ which are assumed to be known. This filter further comprises an adder ADD which forms the sum of the partial products delivered by the multipliers. The general output S delivers the desired signal $S_k$.

If $n_e$ samples are taken instead of only one per chip period, previous considerations remain valid, except that the total number of samples to be taken into account becomes $n_eN$ instead of N. The number of coefficients must also be equal to $n_eN$ but with $n_e$ repetitions for samples located in a same chip period ($T_c$). For example, for a pseudorandom sequence of 31 chips, and for two samples per chip, 2×31=62 samples will have to be taken into account with 62 coefficients formed from 31 pairs of equal coefficients: $C_{61}=C_{60}$, $C_{59}=C_{58}, \ldots, C_1=C_0$. However a weighted sum will always be formed, i.e.:

$$S_k = C_{61}I_k + C_{60}I_{k-1} + \ldots + C_1 I_{k-60} + C_0 I_{k-61}$$

Figure 3:
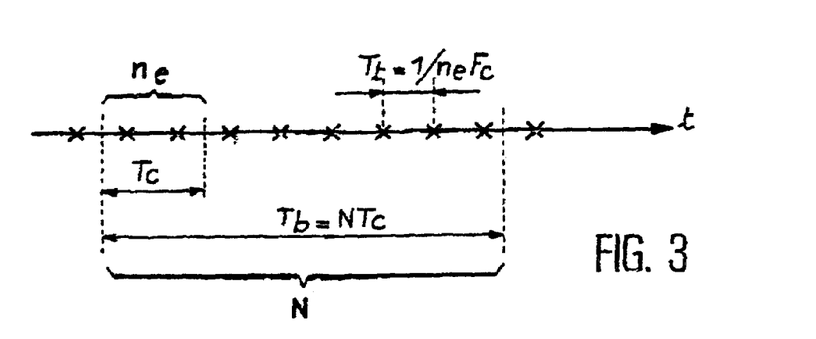
FIG. 3 already described, is a time diagram showing the sampling times in a known filter.

The diagram of FIG. 3 illustrates the sampling times in the case of two samples per chip period. These times are marked by crosses distributed along a time axis. They are separated by a working period $T_f$ equal to $1/n_e F_c$. Period $T_b$ is equal to N times $T_c$ and represents the duration of a data bit (in the illustrated case N=4). Several bits may make up a symbol according to the selected modulations.

In such a technique, the processing rate is directly related to the product $D \times N \times n_e$ where D is the transmitted data rate. This quantity is a frequency, called the operating frequency (or working frequency). The longer the length N of the pseudorandom sequence, the better are the processing gain, resistance to disturbances, discretion of the link and robustness of the latter faced with possible interception. To benefit from these advantages, the direct sequence spread spectrum modulation technique should use length of sequences of at least a few tens of chips.

Furthermore, the performance of a direct sequence spread spectrum system in a multipath environment, depends on its time resolution, which is equal at best to the duration $T_c$ of a chip. The higher the time resolution, the smaller $T_c$, more it will be possible to separate propagation paths and thus increase the diversity order. It is therefore worth having a high chip frequency.

As the present tendency is further to increase data rate, it is understood that operating frequency for processing means will always increase. But this increase finds its limit in the technology of the components used. In the present state of the art, certain compromises have to be adopted between the desired performances (high processing rate) and circuit possibilities. These compromises vary according to the manufacturers:

at HARRIS, component HFA3824, operates around 44 MHz with sequences from 11 to 16 chips and with two samples per chip. Thus, HARRIS obtains up to 4 Mbits/s with a sequence of 11 chips and QPSK (Quaternary Phase Shift Keying using 2 bits per symbol) modulation. With the new component HFA3860, 11 Mbits/s may be obtained through a more complex modulation (8 bits per symbol) and with sequences of a length of only 8 (its working frequency remains at 44 MHz).

at STANFORD TELECOM, component STEL2000A substantially operates at the same rate (45 MHz). It provides links up to 2 Mbits/s with sequences of 11 chips and two samples per chip.

at SIRIUS COMMUNICATION, component SC2001 operates at 47 MHz and processes up to eight samples per chip and uses sequences of a length from 1 to 1023 chips. The maximum binary rate achieved with a minimum length sequence is 11.75 Mbits/s.

The present applicant has himself developed a processing circuit working at a rate of 75 MHz. It processes up to 16 samples per chip for minimum length sequences and allows the use of sequences of a length from 4 to 64 chips. The maximum binary rate reaches 32.5 Mbits/s for sequences of length 4, with one sample per chip.

This discussion of the state of the art shows that in order to attain binary rates greater than 10 Mbits/s, two solutions are available to one skilled in the art: either use a more complex modulation, which increases the number of bits per symbol, while processing relatively short sequence lengths (HARRIS solution with sequences of length 8), or reduce the length of the sequence in order to have a compatible rate with the maximum working frequency imposed by technology (65 MHz for the present applicant).

With the present invention, it is possible to go beyond these compromises by using a parallel architecture filter. The advantages of spectrum spreading may thus be utilized at best by using long pseudorandom sequences, while allowing for high rates.

Parallel architecture filters are already known. For example, document DE-A-196 27 305 describes a filter with several channels working with a plurality of coefficients, whereby these coefficients are utilized through a circular permutation.

Such a filter is not adapted to spectrum spreading with long sequences. On the contrary, the present invention provides a filter with a structure which provides a specific weighted summation adapted to this technique.

DESCRIPTION OF THE INVENTION

The filter of the invention comprises several channels and, in each channel, several stages and it is structured in order to produce intermediate signals which are special weighted sums of input signals and to produce sum signals of these intermediate signals for obtaining the required filtered signals.

More specifically, the object of the present invention is a parallel digital filter receiving p input signals $(I_0, \ldots, I_i, \ldots, I_{p-1})$ and delivering p output signals $(S_0, \ldots, S_i, \ldots, S_{p-1})$ which are the sums of input signals weighted with M coefficients $(C_0, C_1, \ldots, C_{M-1})$, wherein this filter comprises p parallel channels $(V_0, \ldots, V_i, \ldots, V_{p-1})$ receiving the p input signals $(I_0, \ldots, I_i, \ldots, I_{p-1})$, characterized in that it comprises r+1 stages $(E_0, \ldots, E_j, \ldots, E_r)$, where r is the integer portion of the ratio $(M+p-2)/p$, wherein stage of rank j delivers p intermediate signals $(R_0^j, \ldots, R_i^j, \ldots, R_{p-1}^j)$ which are the weighted sums of input signals defined by:

$$R_i^j = \sum_{q=0}^{p-1} (C_{M-1-q+i-jp}) I_{q+jp}$$

the filter further comprising summing means ($\Sigma$) receiving said intermediate signals ($R_i^j$) and delivering p sums defined by:

$$S_i = \sum_{j=0}^{r} R_i^j$$

these p sums forming the p output signals $(S_0, \ldots, S_i, \ldots, S_{p-1})$.

As the filter comprises p channels working at a frequency reduced by a factor p with respect to the frequency of the whole with a given technology, with a given operating frequency and with a fixed sequence length, the rate for the data processed by the whole of the filter of the invention is multiplied by p.

In an embodiment, the number of channels p is equal to 2. The filter then comprises a first channel with first storing means for the samples of even rank and a second channel with second means for storing the samples of odd rank, each channel further respectively comprising first and second means, for respectively calculating even and odd weighted sums, respectively.

The object of the present invention is also a direct sequence spread spectrum signal receiver comprising:

at least an analog/digital converter receiving a spread spectrum signal and delivering digital signals of this signal, at least a digital filter with coefficients adapted to the spread spectrum sequence, this filter receiving the samples delivered by the digital/analog converter and delivering a filtered signal, means for processing the filtered signal able to restore the transmitted data, this receiver being characterized in that the digital filter is the filter defined earlier.

DETAILED DESCRIPTION OF THE PARTICULAR EMBODIMENTS

In the description which follows, it will initially be assumed that the number p of channels is equal to 2.

This will then be generalized to the case when p is any value.

In order to illustrate the principle of the filter of the invention, the very simple case of pseudorandom sequences comprising four chips with only one sample per chip will further be considered as in the discussion of the state of the art. Needless to say that practically, the sequence will comprise many more chips and many samples may be taken during a chip period.

Figure 4A:
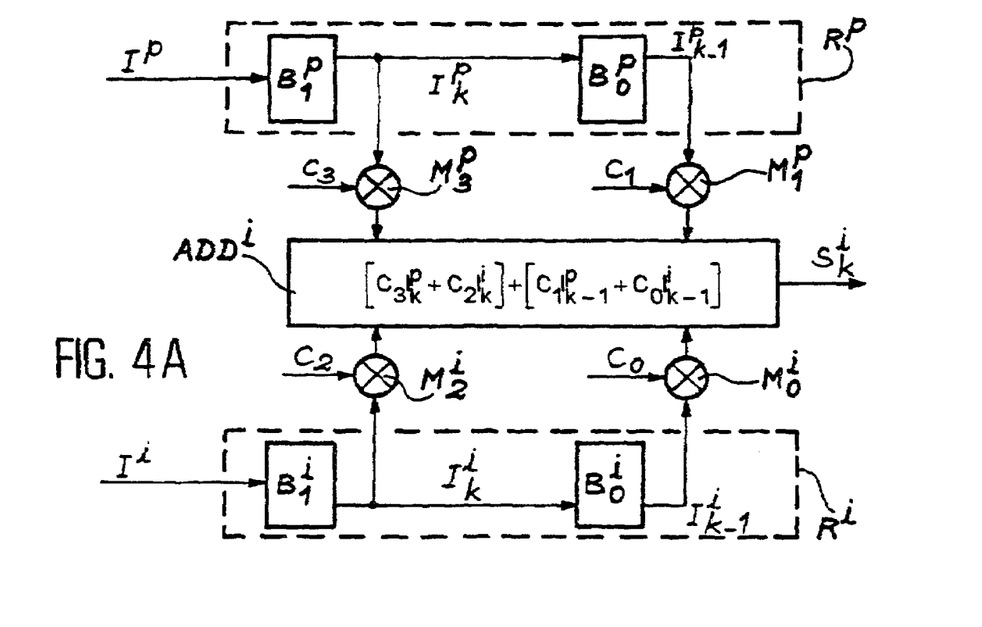
FIGS. 4A, 4B, 4C illustrate a simplified parallel architecture digital filter according to the invention.
Figure 4B:
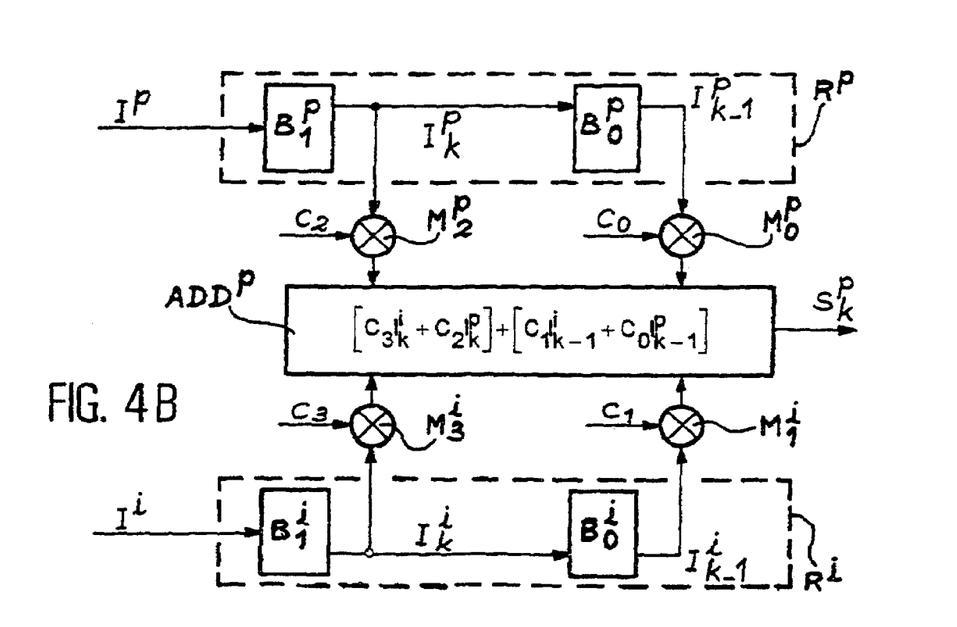
Figure 4C:
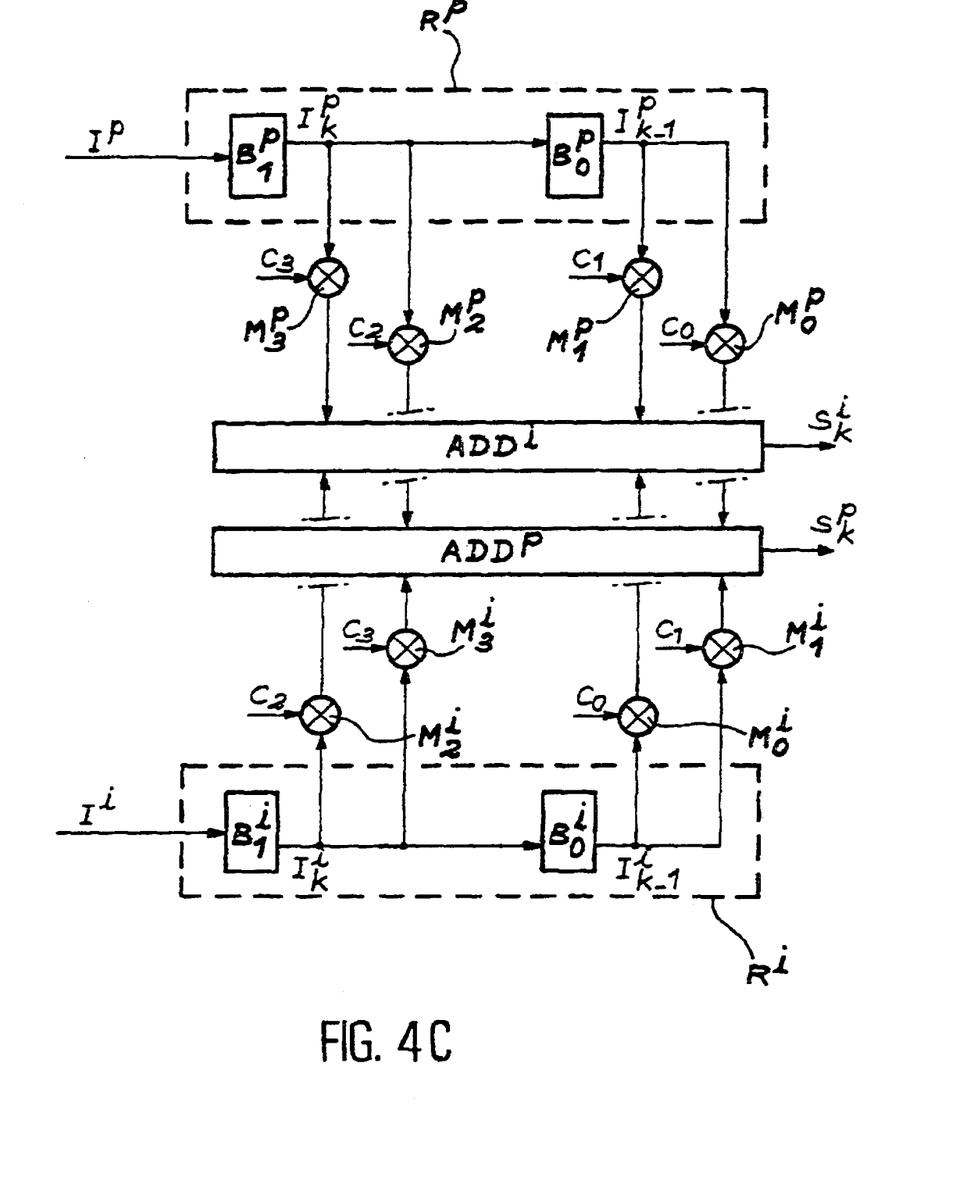

FIGS. 4A and 4B illustrate two imaginary circuits corresponding to the even and odd situations and FIG. 4C illustrates the actual circuit obtained by merging both of these imaginary circuits. In all the figures, the first storing means comprise a first register RP with two flip-flops $B_0^p$, $B_1^p$, able to store two even samples, $I_{k-1}^p$, $I_k^p$, respectively and the second storing means comprise a second register $R^i$ with two flip-flops $B_0^i$, $B_1^i$, able to store two odd samples, $I_{k-1}^i$, $I_k^i$, respectively. These two registers are supplied with even $I^p$ and odd $I^i$ samples, respectively, obtained by means which will be described later in connection with FIG. 5. The illustrated filter also comprises even multipliers $M_0^p$, $M_1^p$, $M_2^p$, $M_3^p$ and odd multipliers $M_0^i$, $M_1^i$, $M_2^i$, $M_3^i$ and two even and odd adders $ADD^p$, $ADD^i$.

When, in the four samples considered, the oldest sample is odd (i.e. $I_{k-1}^i$), the filter must be able to form the following weighted sum $S_i^k$:

$$S_k^i = C_3 I_k^p + C_2 I_k^i + C_1 I_{k-1}^p + C_0 I_{k-1}^i \qquad (1)$$

or:

$$S_k^i = \sum_{j=0}^{1} [C_{3-2j} I_{k-j}^p + C_{2-2j} I_{k-j-1}^i] \qquad (2)$$

At the next sampling time, the oldest sample becomes even and the weighted sum to be calculated becomes $S_k^p$:

$$S_k^p = C_3 I_k^i + C_2 I_k^p + C_1 I_{k-1}^i + C_{k-1}^p \qquad (3)$$

or:

$$S_k^p = \sum_{j=0}^{1} [C_{3-2j} I_{k-j}^1 + C_{2-2j} I_{k-j}^p] \qquad (4)$$

Therefore the even and odd registers should be combined to two different sets of multipliers and adders so that the weighted sums $S_k^i$, and $S_k^p$, may be calculated alternately. FIG. 4A shows the means able to calculate the first weighted sum $S_k^i$. The even samples are weighted by coefficients $C_3$ and $C_1$ whereas the odd samples are weighted by coefficients $C_2$ and $C_0$. In FIG. 4B, the even samples are multiplied, this time, by coefficients $C_2$ and $C_0$ whereas the odd samples are multiplied by $C_3$ and $C_1$ and the second weighted sum $S_k^p$ is obtained.

The complete filter should therefore be as illustrated in FIG. 4C, with four even multipliers $M_3^p$, $M_2^p$, $M_1^p$, $M_0^p$ connected to the even register $R^p$ and four odd multipliers $M_3^i$, $M_2^i$, $M_1^i$, $M_0^i$ connected to the odd register $R^i$. Two adders $ADD^i$, $ADD^p$ each connected to four, alternately even and odd multipliers, complete the register. These two adders deliver correlation signals $S_k^i$ and $S_k^p$.

Figure 5:
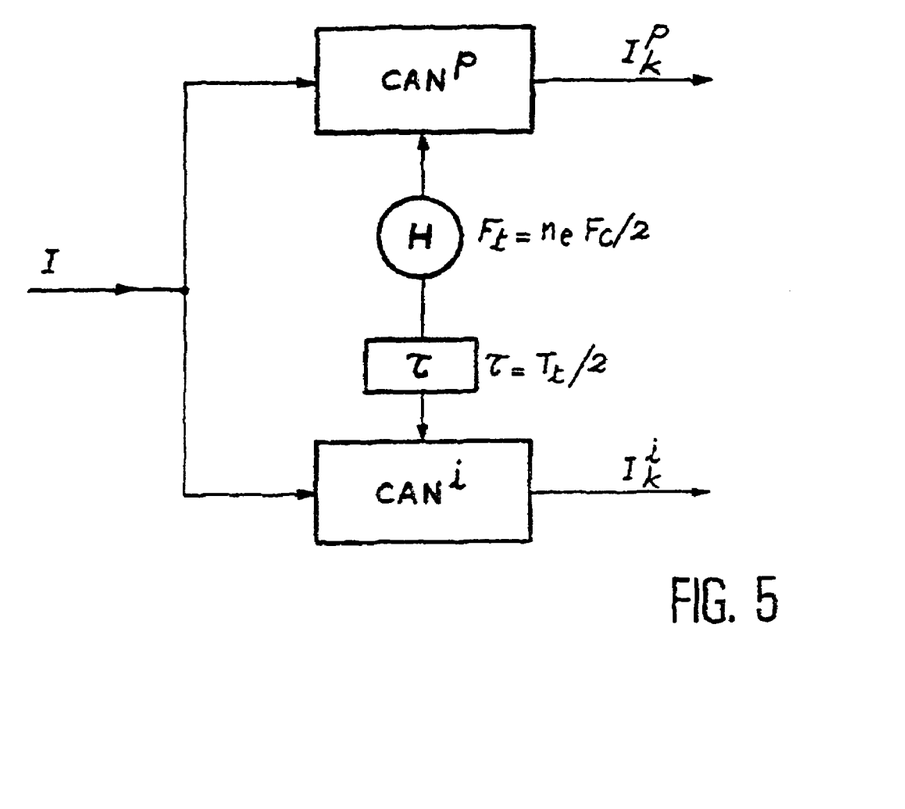
FIG. 5 illustrates means for separating the even and odd samples.

In order to form the two flows of even and odd samples feeding the even and odd registers, respectively, the means illustrated in FIG. 5 may be used. These are two analog/digital converters, even $CAN^p$ and odd $CAN^i$, respectively, receiving a same signal I. These converters are controlled by two signals from a clock H working at the working frequency $F_t$ equal to $n_e F_c/2$, one being shifted by one half-period with respect to the other, i.e. $\tau = T_t/2 = 1/n_e F_c$.

Figure 6:
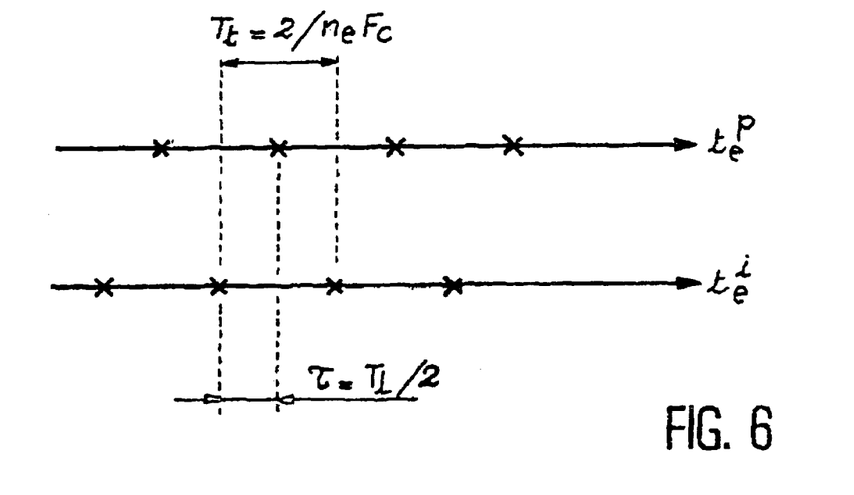
FIG. 6 is a time diagram showing the sampling times and illustrating the reduction in working frequency related to the parallel architecture.

The diagram of FIG. 6 shows the sampling times, $t_e^p$ for the even converter $CAN^p$ and $t_e^i$ for the odd converter $CAN^i$. Two series of samples are thereby obtained, with samples spaced out with the working period $T_t = 2/n_e F_c$, both series being shifted by the value $T_t/2$ relatively to each other. So globally, this is still a sampling at frequency $n_0 F_c$, but at the level of the component used in each channel, the working frequency is halved. By comparing with FIG. 3 already described, it is immediately apparent that by resorting to the parallel architecture, the working frequency of the components is divided by 2.

Comparison between FIG. 4C and FIG. 2 also shows that the filter of the invention has the same number of flip-flops than a filter from the prior art, but twice as many multipliers and two adders instead of only one. This increase in the number of components is widely compensated by the increase in data rate, in other words by the reduction in working frequency (factor 2).

Figure 7:
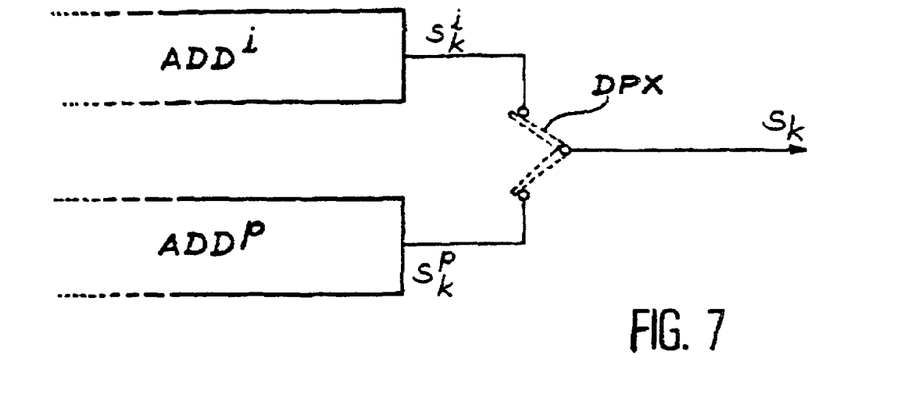
FIG. 7 shows the filter output means for composing a unique filtered signal.

Combining the two signals obtained at the output of adders $ADD^i$ and $ADD^p$ remains to be done if need be. FIG. 7 shows that for this purpose, a duplexer DPX is sufficient which alternately takes one of the sums $S_k^i$ then the other one $S_k^p$ in order to obtain a unique filtered signal $S_k$.

Figure 8:
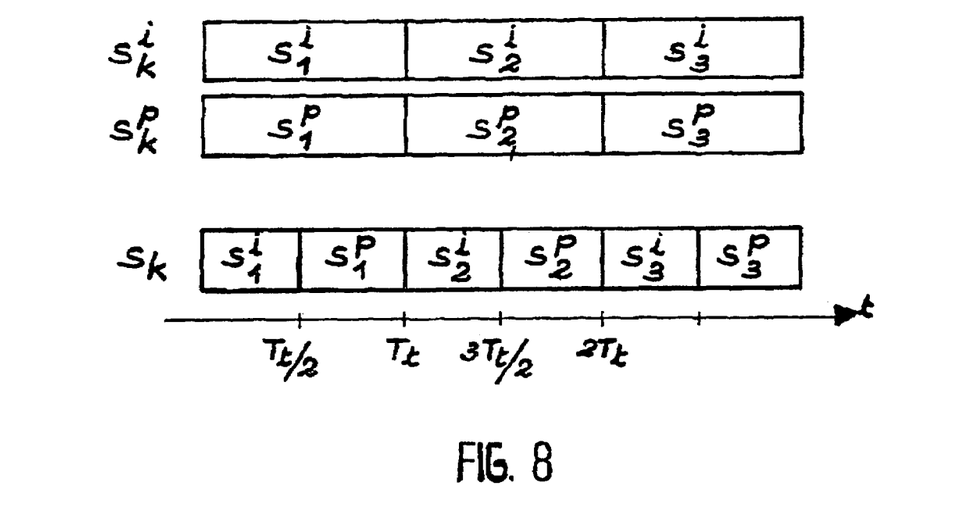
FIG. 8 illustrates the time history of the output signals and of their interlacing in order to form the unique filtered signal.

The diagram of FIG. 8 shows the time history of the first weighted sums $S_k^i$ and of the second weighted sums $S_k^p$ and of the combined sum $S_k$. At each half-period $T_c/2=1/n_eF_c$, the value of the weighted sum is obtained as for a sequential filter which would operate at frequency $n_eF_c$.

Of course, case N=4 and $n_e=1$ is hardly a realistic one and it is only used for describing the invention. Practically, each register will have $N \times n_e/2$ flip-flops and there will be $2 \times N \times n_e$ multipliers and $Nn_e$ weighting coefficients (N groups of $n_e$). The general expression of the sums to be calculated may be obtained by setting $M=N \times n_e$. The weighted sums $S_k^p$ and $S_k^i$ are slightly different according to whether M is even or odd:

1) Odd M

The filter calculates the following two quantities:

$$S_k^p = \sum_{j=0}^{(M-1)/2} [C_{M-1-2j} I_{k-j}^i + C_{M-2-2j} I_{k-j}^p] \quad (5)$$

$$S_k^i = \sum_{j=0}^{(M-1)/2} [C_{M-1-2j} I_{k-j}^p + C_{M-2-2j} I_{k-j-1}^i] \quad (6)$$

2) Even M:

The filter calculates the following two quantities:

$$S_k^p = \sum_{j=0}^{(M-2)/2} [C_{M-1-2j} I_{k-j}^1 + C_{M-2-2j} I_{k-j}^p] \quad (7)$$

$$S_k^1 = \sum_{j=0}^{(M-2)/2} [C_{M-1-2j} I_{k-j}^p + C_{M-2-2j} I_{k-j}^1] \quad (8)$$

By taking M=4, N=4 and $n_e=1$, the example of FIGS. 4A for $S_k^i$ and 4B for $S_k^p$ and relationships (2) and (4) are found again.

Figure 9:
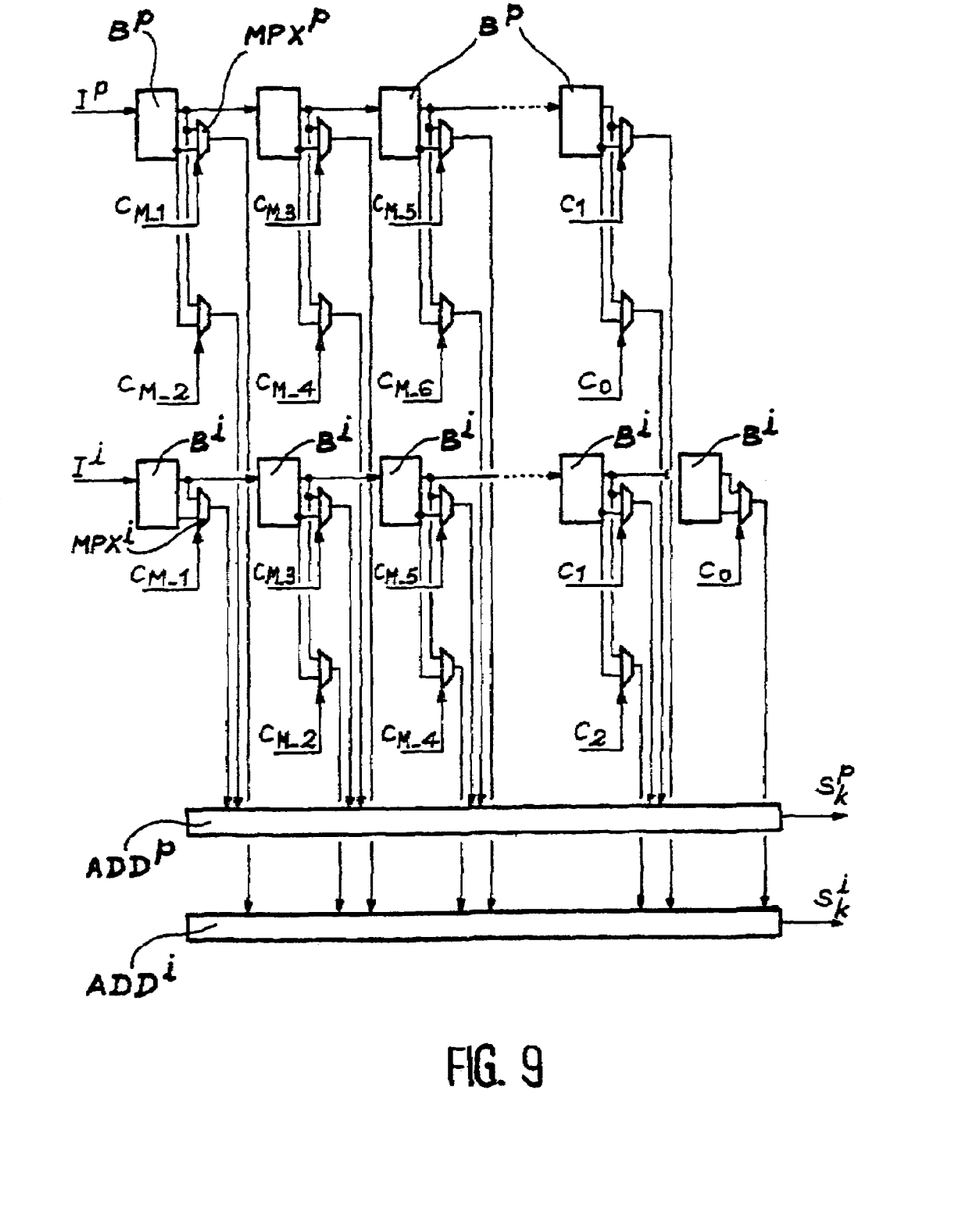
FIG. 9 illustrates a particular embodiment of the filter with complementary output flip-flops and multiplexers.

In the embodiment of FIG. 4C, the multipliers are represented by means receiving the sample on the one hand and on the other hand the multiplicative coefficient. In the application to spectrum spreading and binary spreading sequences, the filter coefficients are not arbitrary but reflect the sign of the chips forming the pseudorandom sequence. These coefficients are therefore equal to +1 or to −1. These multipliers may also assume a particular form as each sample has only to be simply multiplied by +1 or by −1. Flip-flops and multipliers of a particular type as illustrated in FIG. 9 may then be used. It is seen that each shift register comprises cells $B^p$ or $B^i$ with an input D and a direct output Q, wherein input D is connected to the direct output of the preceding flip-flop and the direct output Q is connected to the input D of the following flip-flop. Each flip-flop further comprises a complemented output !Q. Multiplexers $MPX^p$, $MPX^i$ have two inputs respectively connected to the direct Q and complemented !Q outputs of the corresponding flip-flops, and a control input receiving a positive or negative control signal. The output of the multiplexers are connected to adders $ADD^p$ and $ADD^i$.

The diagram of FIG. 9 corresponds to the case when the number M is odd. So there is an extra flip-flop in the odd channel as compared with the even channel. The M coefficients are noted as $C_{M-1}, C_{M-2}, \ldots, C_1, C_0$. If the number of the samples per chip is different from one, these coefficients would be equal by packets of $n_e$.

In FIG. 9, the channels are represented horizontally. Stages including the delay devices may be seen vertically. With two input signals (even and odd), p=2 and taking M=4 for example, there are three stages, plus a last delay device. These considerations will be generalized later on.

Figure 10:
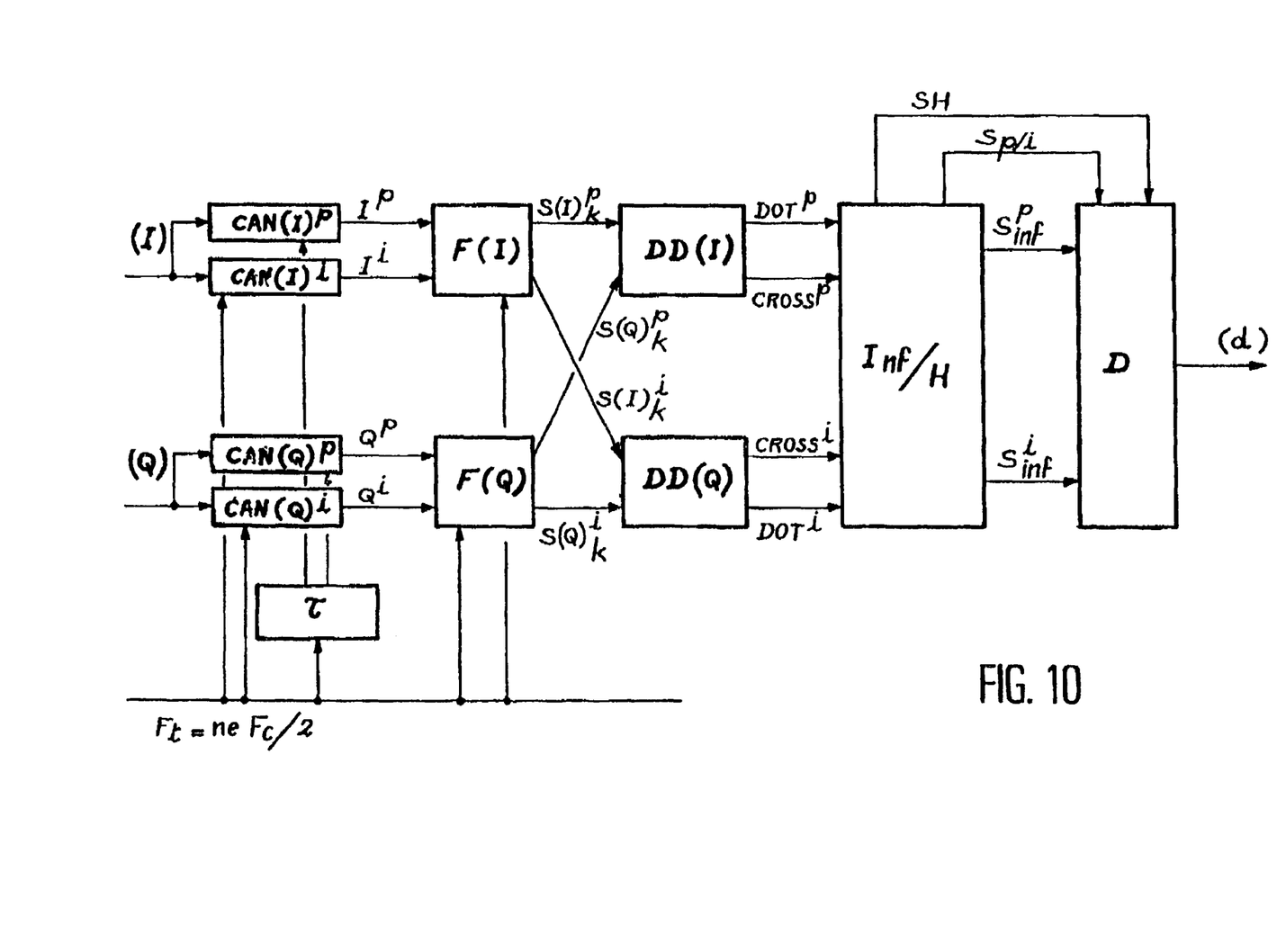
FIG. 10 schematically shows a two channel (I,Q) receiver using a parallel architecture filter according to the invention in each channel.

The filter which has just been described may advantageously be used in spread spectrum signal receivers and, in particular, in two channel receivers, one for processing the signal in phase with the carrier, and the other for processing the signal in phase quadrature with said carrier. This embodiment correspond to phase difference modulations (with two or more phase states). Thus FIG. 10 schematically shows such a receiver. As illustrated, it comprises:

in channel I, two analog/digital converters $CAN(I)^p$, $CAN(I)^i$ controlled at frequency $n_eF_c/2$ and shifted by $\tau=1/n_eF_c$ as described in conjunction with FIG. 5, and a parallel architecture digital filter F(I) as described earlier;

in channel Q, means are similar, i.e. two analog/digital converters $CAN(Q)^p$, $CAN(Q)^i$, a parallel architecture digital filter F(Q) delivering the even $S(Q)_k^i$ and odd $S(Q)_k^i$ filtering signals.

Figure 11:
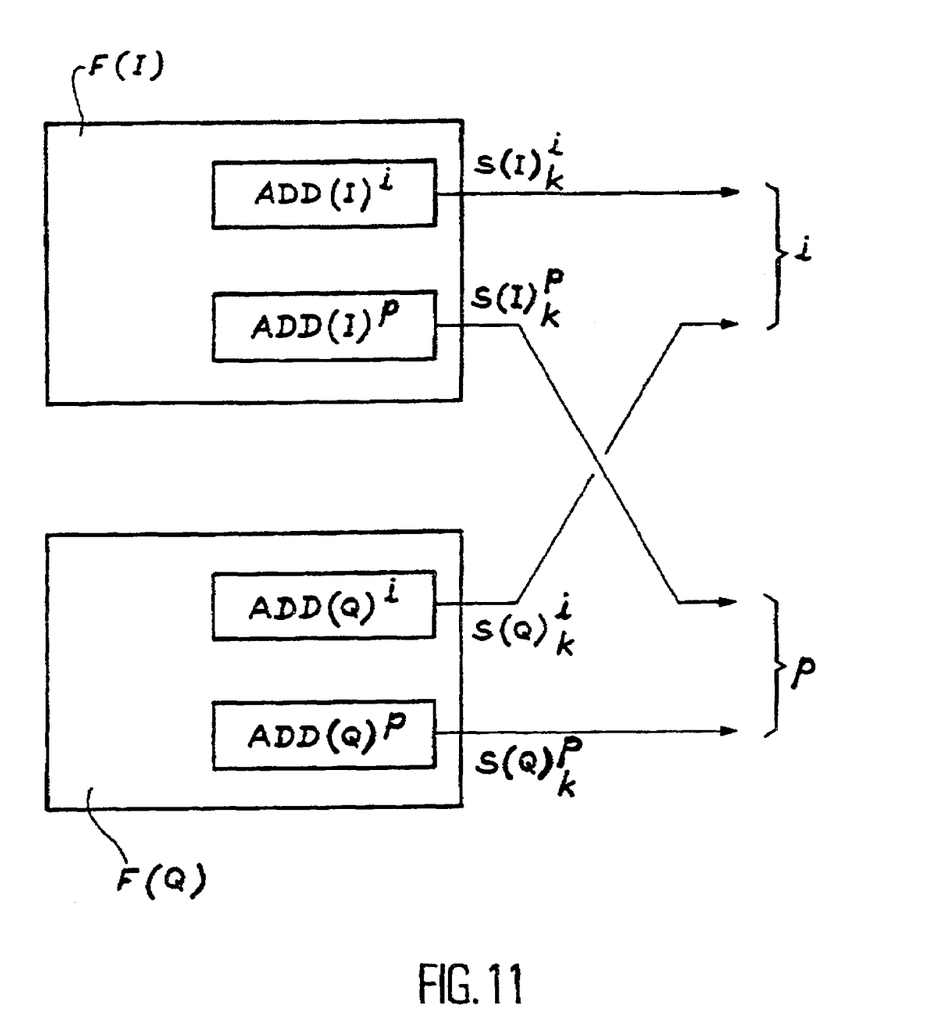
FIG. 11 shows both signal pairs delivered by the filters of both channels.

In the illustrative alternative embodiment, even $S(I)_k^p$ and odd $S(Q)_k^i$ filtering signals delivered by two odd and even adders of the filter are directly used without recombining these signals into a unique signal. This matter is specified in FIG. 11:

in channel I, filter F(I) comprises two adders $ADD(I)^i$, and $ADD(I)^p$ delivering weighted sums $S(I)_k^i$ and $S(I)_k^p$;

in channel Q, filter F (Q) comprises two adders $ADD(Q)^i$, and $ADD(Q)^p$ delivering weighted sums $S(Q)_k^i$ and $S(Q)_k^p$.

Referring back to FIG. 10, the receiver further comprises two differential demodulation circuits DD(I), DD(Q), wherein the first receives the first weighted (even) sums i.e. $S(I)_k^p$ and $S(Q)_k^p$ and the second the second weighted (odd) sums, i.e. $S(I)_k^i$ and $S(Q)_k^i$. Each of these circuits delivers DOT and CROSS signals, i.e. first signals $DOT^p$ and $CROSS^p$ for the first, and second signals $DOT^i$ and $CROSS^i$ for the second. As a reminder, a DOT signal is equal to $I_k I_{k-1}+Q_k Q_{k-1}$ and a CROSS signal equal to $Q_k I_{k-1}-I_k Q_{k-1}$ if $I_k$ and $Q_k$ refer to signals of rank k from channels I and Q.

The receiver further comprises a circuit Inf/H which receives the various DOT and CROSS signals and delivers first and second information signals $S_{inf}^p$ and $S_{inf}^i$, a parity signal Sp/i and a clock signal SH determined from the correlation peaks.

Finally the receiver comprises a decision circuit D which receives first and second information signals $S_{inf}^p$, $S_{inf}^i$, the parity signal Sp/i with which they may be distinguished from one another and the clock signal SH which enables information to be restored. The latter circuits are similar to those of standard receivers except that they distinguish the peaks of the first and second DOT and CROSS signals, by means of the parity signal Sp/i.

Figure 12:
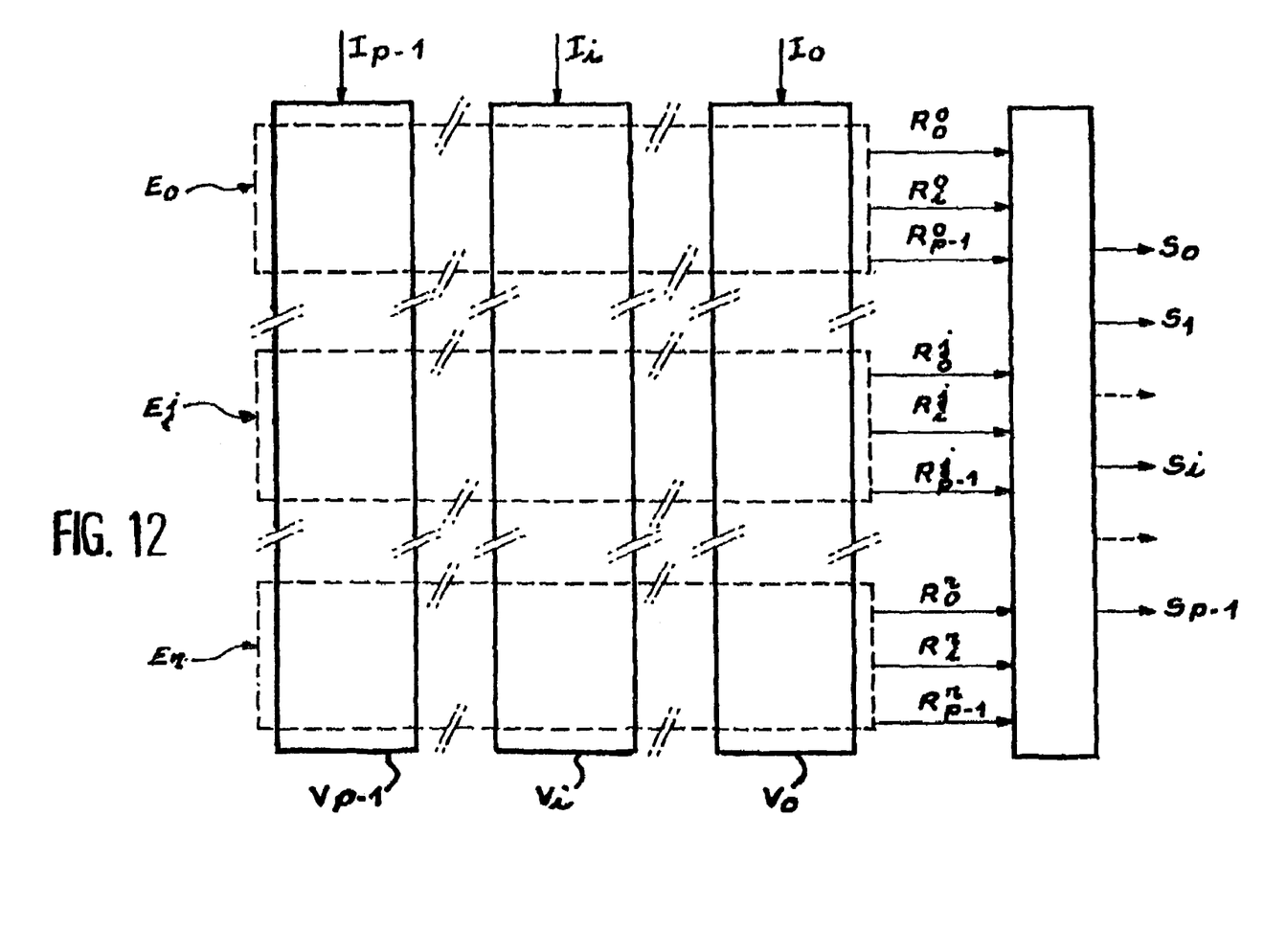
FIG. 12 shows the filter architecture in the general case of p channels.
Figure 13:
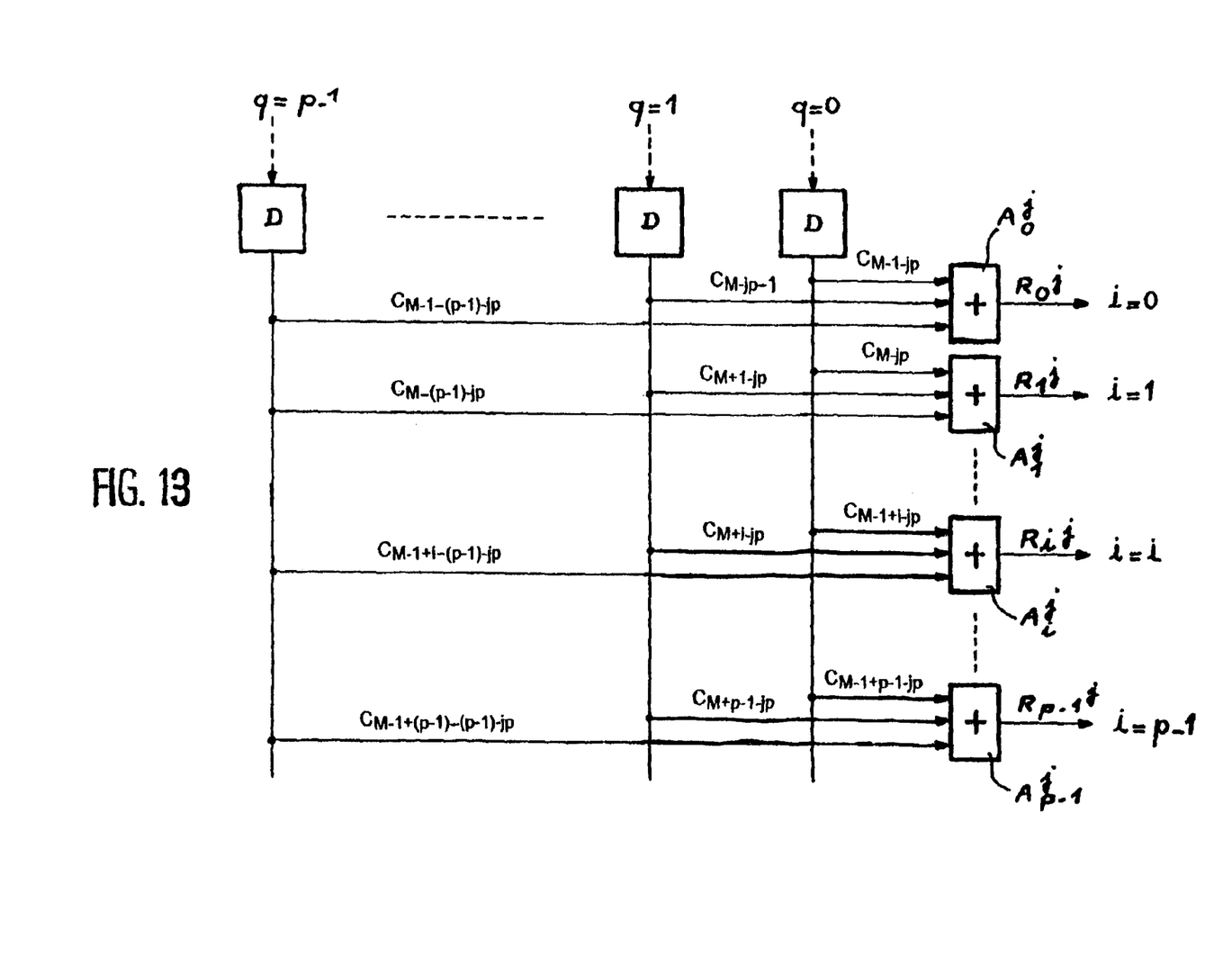
FIG. 13 shows the structure of one of the stages.
Figure 14:
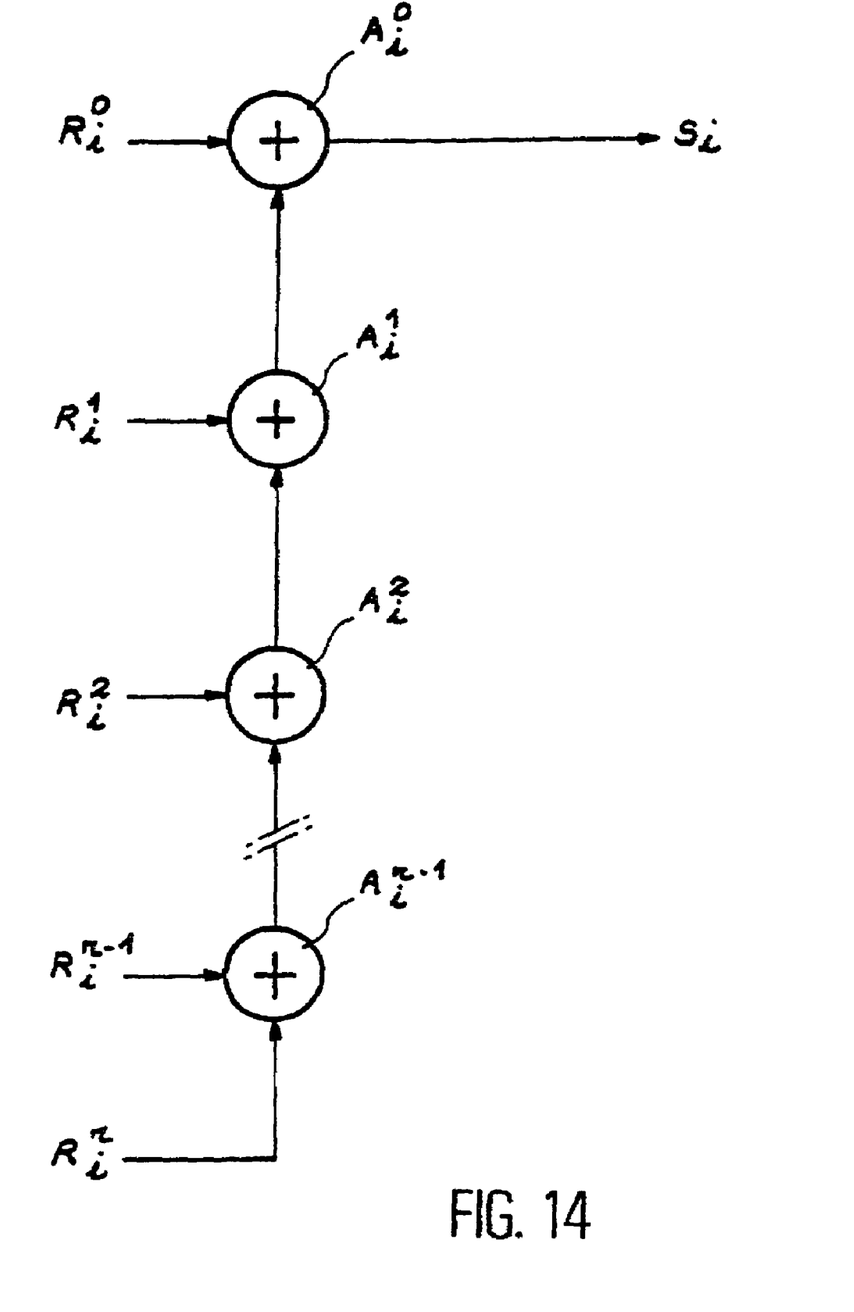
FIG. 14 illustrates a particular embodiment of the means for summing the intermediate signals.

FIGS. 12, 13 and 14 generalize the description which has just been made, to the case of p parallel channels, p having an arbitrary value.

FIG. 12, first of all, illustrates the general structure of the filter with p parallel channels $V_0, \ldots, V_i, \ldots, V_{p-1}$ (it will be noted that these channels are represented vertically, for reasons of convenience unlike the case of FIGS. 4A, 4B, 4C), and r+1 stages, wherein number r is the integral portion of the quantity (M+p−2)/p. For example, if M=4 and p=2, r=2, so there are three stages, as was the case for FIG. 9 already described.

The p input signals $I_0, \ldots, I_i, \ldots, I_{p-1}$ are applied to the p channels. Each of these signals is delayed by $1/F_t$ where $F_t$ is the working frequency. The stages deliver intermediate signals noted as R with a lower index i designating the number of the channel (from 0 to p−1) and an upper index j designating the rank of the stage (from 0 to r). Thus, stage $E_j$ delivers p intermediate signals $R_i^j$, i ranging from 0 to p−1, according to the relationship:

$$R_i^j = \sum_{q=0}^{p-1} (C_{M-1-q+i-jp}) I_{q+jp}$$

The weighting coefficient which may be noted as $C_x$ where x is the index, may be taken as equal to zero if x<0 or if x≧M. In other words, the coefficients range from $C_0$ to $C_{M-1}$.

The filter further comprises summing means Σ receiving the intermediate signals $R_i^j$ and delivering p sums defined by:

$$S_i = \sum_{j=0}^{r} R_i^j$$

these p sums forming p output signals $S_0, \ldots, S_i, \ldots, S_{p-1}$ for the filter (with only two channels, two output signals are obtained, called in the first part of the description, even and odd signals).

FIG. 13 shows an embodiment of the stage of rank j. In this figure, the p squares marked D are delay circuits and the indexed letters C are coefficients with which these signals are weighted. For simplifying the figure, the multipliers are not specially represented which means that the signal transferred through a connection is weighted by the coefficient marked above this connection.

Thus, it is seen that the p signals delivered by the p delay circuits are first multiplied by coefficients $C_{M-1-jp}, \ldots, C_{M-1-(p-1)-jp}$ and the p thereby weighted signals are added in an adder $A_0^j$ in order to obtain a first intermediate signal $R_0^j$:

$$R_0^j = \sum_{q=0}^{p-1} (C_{M-1-q-jp}) I_{q+jp}$$

The formation of these intermediate signals is thus repeated with coefficients $C_{M-1-jp}, \ldots, C_{M+(p-1)-jp}$ and adder $A_1^j$, with coefficients $C_{M-1+i-jp}, \ldots, C_{M-1+i-(p-1)-jp}$ and adder $A_i^j$, etc. . . . , coefficients $C_{M-1-(p-1)-jp}, \ldots, C_{M-1-(p-1+(p-1)-jp}$ and adder $A_{p1}^j$.

Finally, FIG. 14, illustrates an embodiment of a portion of the summing means Σ. For obtaining the output signal $S_i$ defined by:

$$S_i = \sum_{j=0}^{r} R_i^j$$

all the intermediate signals with the same index i are added by means of r adders $A_i^0, A_i^1, \ldots, A_i^j, \ldots, A_i^{r-1}$ connected in series and receiving the intermediate signals $R_i^0, R_i^1, \ldots, R_i^j, \ldots, R_i^r$ respectively.

In order to illustrate the passing to the general case from certain particular cases, the case may be considered when p is equal to 2. The value of the intermediate signals is then:

$$R_i^j = \sum_{q=0}^{1} (C_{M-1-q+i-2j}) I_{q+2j}$$

On the other hand, by taking M=7, the value of the intermediate signals becomes:

$$R_i^j = \sum_{q=0}^{1} (C_{6-q+i-2j}) I_{q+2j}$$

or $$R_i^j = (C_{6+1-2j}) I_{2j} + (C_{5+1-2j}) I_{1+2j}$$

Number r is equal to the integer portion of (M+p−2)/2 that is 3. So there are 4 stages.

Index i has two values 0 and 1 and the intermediate signals have expressions:

$$R_0^j = (C_{6-2j}) I_{2j} + (C_{5-2j}) I_{1+2j}$$

$$R_1^j = (C_{7-2j}) I_{2j} + (C_{6-2j}) I_{1+2j}$$

The values of the output signals are then:

$$S_0 = \sum_{j=0}^{3} R_0^j = R_0^0 + R_0^1 + R_0^2 + R_0^3$$

$$S_1 = \sum_{j=0}^{3} R_1^j = R_1^0 + R_1^1 + R_1^2 + R_1^3$$

So respectively:

$$S_0 = C_6 I_0 + C_5 I_1 + C_4 I_2 + C_3 I_3 + C_2 I_4 + C_1 I_5 + C_0 I_6 + 0.I_7$$

and $$S_1 = 0.I_0 + C_6 I_1 + C_5 I_2 + C_4 I_3 + C_3 I_4 + C_2 I_5 + C_1 I_6 + C_0 I_7$$

Figure 15:
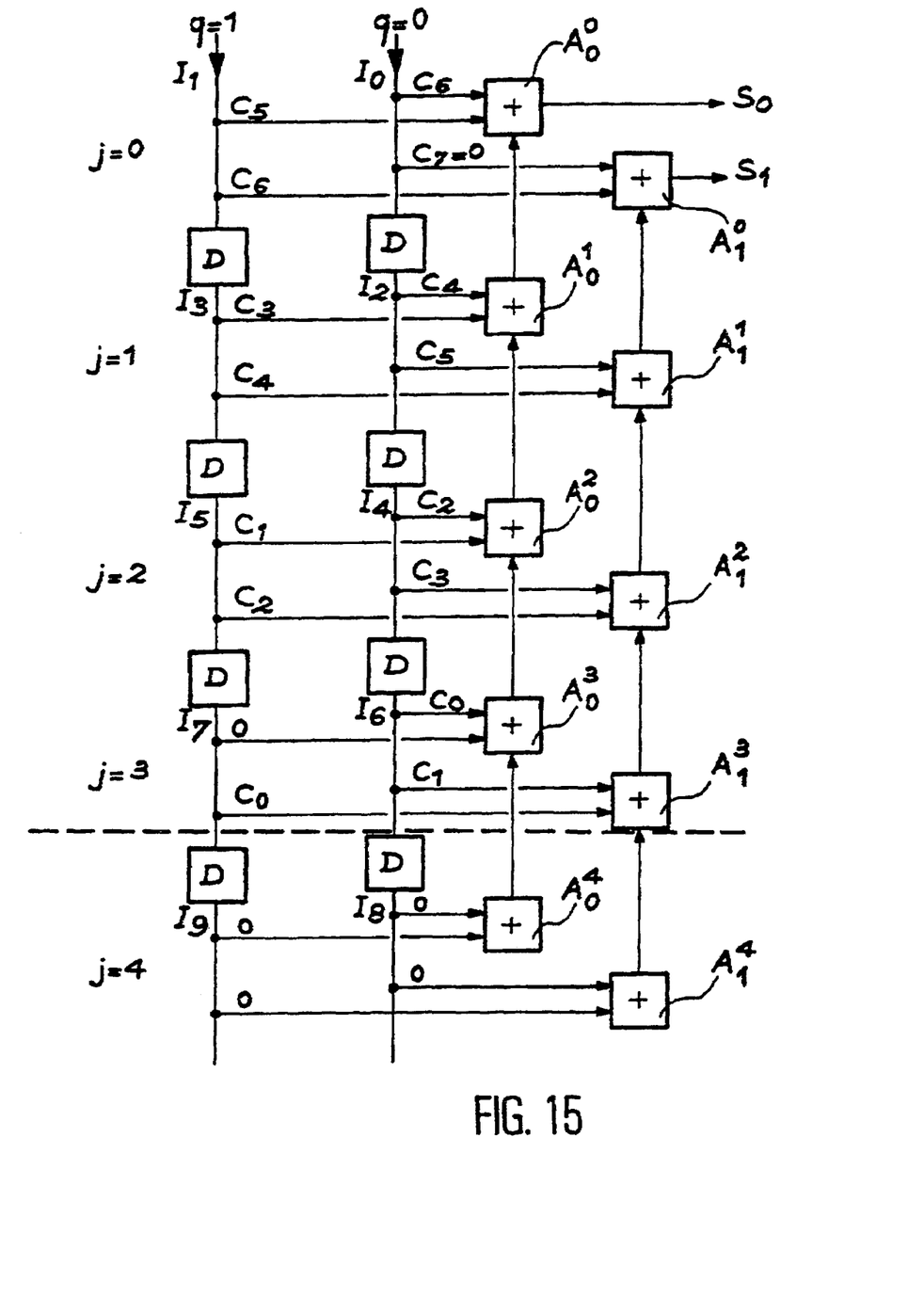
FIG. 15 illustrates a particular filter case for p=2 and M=7.

FIG. 15 illustrates the corresponding filter with its two channels (q=0, q=1) its four stages (j=0 to j=3) (stage j=4 is forced to zero), its two input signals $I_0$, $I_1$, its two output signals $S_0$, $S_1$ and its seven coefficients $C_0$, $C_1$, ..., $C_6$ (coefficients with an index equal to 7 and beyond or negative are zero).

What is claimed is:

1. A parallel architecture digital filter receiving p input signals ($I_0$, ..., $I_i$, ... $I_{p-1}$) and delivering p output signals ($S_0$, ..., $S_1$, ..., $S_{p-1}$) which are the sums of the input signals weighted with M coefficients ($C_0$, $C_1$, ..., $C_{M-1}$), this filter comprising p parallel channels ($V_0$, ..., $V_i$, ..., $V_{p-1}$) receiving the input signals ($I_0$, ..., $I_i$, ..., $I_{p-1}$), characterized in that it comprises r+1 stages ($E_0$, ..., $E_j$, ..., $E_r$), where r is the integer portion of ratio (M+p−2)/2, the stage of rank j delivering p intermediate signals ($R_0^j$, ... $R_1^j$, ... $R_{p-1}$) which are the weighted sums of the input signals defined by:

$$R_i^j = \sum_{q=0}^{p-1} (C_{M-1-q+i-jp}) I_{q+jp}$$

the filter further comprising a summing means receiving said intermediate signals ($R_i^j$) and delivering p sums defined by:

$$S_i = \sum_{j=0}^{r} R_i^j$$

these p sums forming p output signals ($S_0$, ..., $S_i$, ... $S_{p-1}$).

2. The digital filter according to claim 1, wherein the number of channels p is equal to 2, the filter then comprising a first channel with first storing means ($R^p$) for storing samples of the input signals of even rank ($I_k^p$, $I_{k-1}^{pi}$, ...) and a second channel with second storing means ($R^i$) for storing the samples of the input signals of odd rank ($I_k^p$, $I_{k-1}^i$, ...), and further comprising first ($M_0^p$, ..., $M_1^p$, ... $ADD^p$) and second ($M_0^i$, ..., $M_1^i$, ..., $ADD^i$) means, for respectively calculating even ($S_k^p$) and odd ($S_k^i$) weighted sums.

3. The filter according to claim 2, wherein the first and the second means for calculating the even and odd weighted sums each comprise multipliers ($M_1^p$, $M_3^p$, ..., $M_0^i$, $M_2^i$ ...) each receiving a respective sample of the input signals ($I_{k-1}^p$, $I_k^p$, ..., $I_{k-1}^i$, $I_k^i$ ...) and a respective weighting coefficient ($C_1$, $C_3$, $C_0$, $C_2$) ($C_0$, $C_2$, $C_1$, $C_3$), and an adder ($ADD^i$, $ADD^p$) connected to the multipliers.

4. The filter according to claim 2, wherein the first and the second storing means comprises a first ($R^p$) and a second ($R^i$) shift register, respectively.

5. The filter according to claim 4, wherein each shift register ($R^p$, $R^i$) comprises cells ($B^p$) ($B^i$) arranged in series, each cell consisting of a flip-flop with an input (D) and a direct output (Q), wherein the input of a flip-flop of rank k is connected to the direct output (Q) of the flip-flop of rank k−I and the direct output (Q) of the flip-flop of rank k is connected to the input of the flip-flop of rank k+1, each flip-flop further comprising a complemented output (!Q), each of the multipliers being a multiplexers ($MPX^p$) ($MPX^i$) with two inputs connected to the direct (Q) and complemented (!Q) outputs of the flip-flops, respectively, each multiplexer further comprising a control input receiving a positive or negative control signal ($C_0$, $C_1$, ..., $C_{m-1}$) and an output, which is connected to a one of the two inputs according to the sign of the control signal.

6. A receiver for direct sequence spread spectrum signals comprising:
at least an analog/digital converter (CAN(I), CAN(Q)) receiving a spread spectrum signal and delivering digital samples of this signal,
at least a digital filter (F(I), F(Q)) with coefficients ($C_j$) adapted to a spread spectrum sequence, this filter receiving the digital samples delivered by the analog/digital converter and delivering a filtered signal,
means (DD, Inf/H, D) for processing the filtered signal to restore transmitted data (d), this receiver being characterized in that the digital filter (F(I), F(Q)) is a parallel architecture digital filter according to claim 1.

7. The receiver according to claim 6, comprising first and second channels in parallel, the first (I) for processing a signal in phase with a carrier and the second (Q) for processing a signal in phase quadrature with said carrier, each channel comprising a respective parallel architecture digital filter (F(I), F(Q)) with, for the first channel (I), notably, first and second adders ($ADD(I)^p$, $ADD(I)^i$) delivering first and second weighted sums ($S(I)_k^p$, $S(I)_k^i$) and, for the second channel (Q), notably, first and second adders ($ADD(Q)^p$, $ADD(Q)^i$) delivering first and second weighted sums ($S(Q)_k^p$, $S(Q)_k^i$).

8. The receiver according to claim 7, wherein the first channel (I) comprises a first differential demodulation circuit (DD(I)) and the second channel (Q) comprises a second differential demodulation circuit (DD(Q)), the first differential demodulation circuit (DD(I)) receiving the first weighted sums ($S(I)_k^p$, $S(Q)_k^p$) delivered by the respective parallel architecture digital filters (F(I), F(Q)) of the first and second channels (I), (Q), and delivering a first DOT and a first CROSS signal ($DOT^p$, $CROSS^p$), the second differential demodulation circuit (DD(Q)) receiving the second weighted sums ($S(I)_k^i$) and ($S(Q)_k^i$) delivered by the respective parallel architecture digital filters (F(I), F(Q)) of the first and second channels (I, Q) and delivering a second DOT and a second CROSS signal ($DOT^i$, $CROSS^i$).

9. The receiver according to claim 8, comprising a clock and an information circuit (Inf/H) receiving each of the first and second DOT and CROSS signals ($DOT^p$, $CROSS^p$), ($DOT^i$, $CROSS^i$) delivered by the first and second differential demodulation circuits (DD(I), DD(Q)) and delivering even and odd information signals ($S_{inf}^p$, $S_{inf}^i$), a clock signal (SH) and a parity signal (Sp/i).

10. A receiver for direct sequence spread spectrum signals comprising:
at least an analog/digital converter (CAN(I), CAN(Q)) receiving a spread spectrum signal and delivering digital samples of this signal,
at least a digital filter (F(I), F(Q)) with coefficients ($C_j$) adapted to the spread spectrum sequence, this filter receiving the samples delivered by the digital/analog converter and delivering a filtered signal,
means (DD, Inf/H, D) for processing the filtered signal able to restore the transmitted data (d), this receiver being characterized in that the digital filter (F(I), F(Q)) is a parallel architecture digital filter according to claim 5.

* * * * *